(12) United States Patent
Kirby et al.

(10) Patent No.: US 11,656,247 B2
(45) Date of Patent: May 23, 2023

(54) MICRO-COAXIAL WIRE INTERCONNECT ARCHITECTURE

(71) Applicant: Intel Corporation, Santa Clara, CA (US)

(72) Inventors: Ronald Michael Kirby, Portland, OR (US); Erkan Acar, Hillsboro, OR (US); Joe Walczyk, Tigard, OR (US); Youngseok Oh, Portland, OR (US); Justin M Huttula, Hillsboro, OR (US); Mohanraj Prabhugoud, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 326 days.

(21) Appl. No.: 16/473,378

(22) PCT Filed: Mar. 31, 2017

(86) PCT No.: PCT/US2017/025538
§ 371 (c)(1),
(2) Date: Jun. 25, 2019

(87) PCT Pub. No.: WO2018/182727
PCT Pub. Date: Oct. 4, 2018

(65) Prior Publication Data
US 2020/0141979 A1    May 7, 2020

(51) Int. Cl.
*G01R 1/07* (2006.01)
*G01R 1/04* (2006.01)
*G01R 1/073* (2006.01)

(52) U.S. Cl.
CPC ....... *G01R 1/07357* (2013.01); *G01R 1/0466* (2013.01)

(58) Field of Classification Search
CPC .................... G01R 1/07357; G01R 1/0466
See application file for complete search history.

(56) References Cited

U.S. PATENT DOCUMENTS

| 10,644,458 | B2 * | 5/2020 | Oh ................. H01R 13/6594 |
| 2005/0159050 | A1 | 7/2005 | Hama et al. |
| 2005/0260868 | A1 | 11/2005 | Lee |
| 2011/0057664 | A1 | 3/2011 | Miyata |
| 2011/0068815 | A1 | 3/2011 | Dabrowiecki et al. |

(Continued)

FOREIGN PATENT DOCUMENTS

WO    WO-2018182727 A1    10/2018

OTHER PUBLICATIONS

"International Application Serial No. PCT US2017 025538, International Preliminary Report on Patentability dated Oct. 10, 2019", 9 pgs.

(Continued)

*Primary Examiner* — Reena Aurora
(74) *Attorney, Agent, or Firm* — Schwegman Lundberg & Woesnner, P.A.

(57) ABSTRACT

A coaxial wire interconnect architecture and associated methods are described. In one example, the coaxial wire interconnect architecture is used in a test socket interconnect array. Flexible bends are formed in one or more of the coaxial wire interconnects to provide compliant connections to an electronic device during testing.

25 Claims, 6 Drawing Sheets

(56) References Cited

U.S. PATENT DOCUMENTS

2016/0178663 A1 6/2016 Prabhugoud et al.
2019/0212366 A1* 7/2019 Tadayon ............. H01L 21/0273

OTHER PUBLICATIONS

"International Application Serial No. PCT/US2017/025538, International Search Report dated Dec. 27, 2017", 3 pgs.
"International Application Serial No. PCT/US2017/025538, Written Opinion dated Dec. 27, 2017", 7 pgs.

* cited by examiner

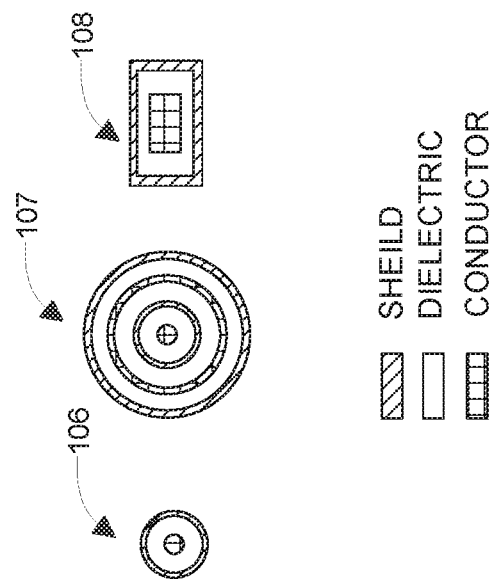
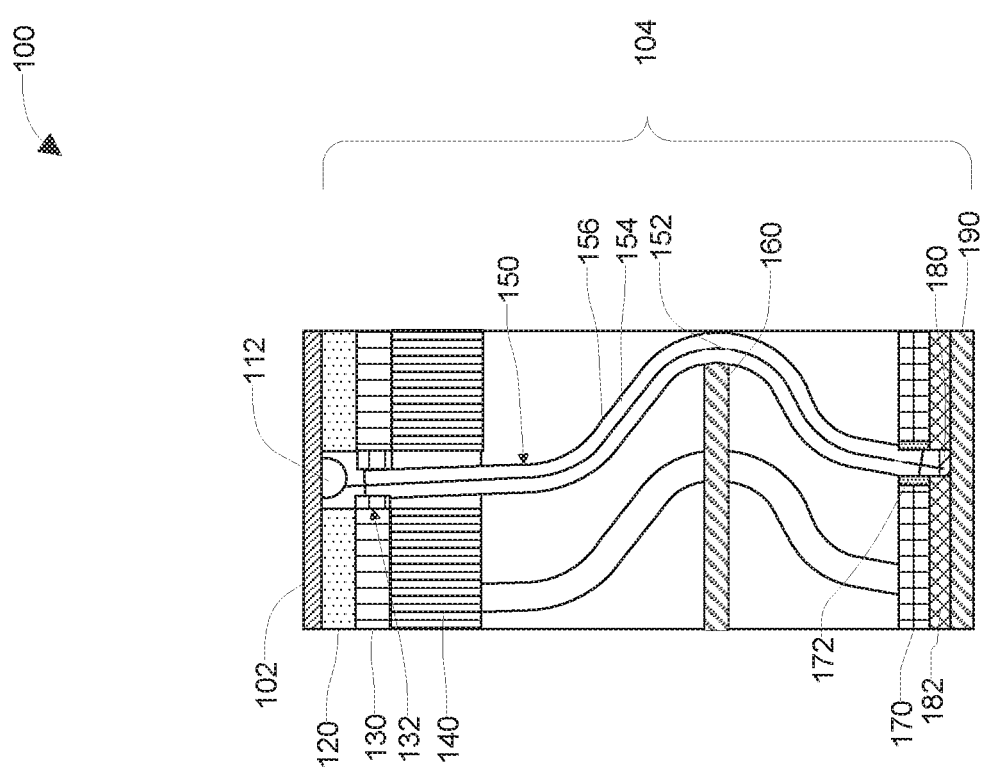
FIG. 1B
FIG. 1A

MICRO-COAXIAL WIRE INTERCONNECT ARCHITECTURE

PRIORITY APPLICATION

This application is a U.S. National Stage Application under 35 U.S.C. 371 from International Application No. PCT/US2017/025538, filed Mar. 31, 2017, published as WO2018/182727, which is incorporated herein by reference in its entirety.

BACKGROUND

Future roadmaps for high end client and server products suggest socket technology may need bandwidth beyond 20 GHz and scalable link interface (SLI) pitch scaling down to 0.3 mm. Existing technologies utilize coaxial pogo pin interconnects, which may be limited to a bandwidth of less than 20 GHz and a pitch of 0.7 mm. Improved interconnect configurations and methods to meet these and other needs are desired.

BRIEF DESCRIPTION OF THE DRAWINGS

FIG. 1A shows an example of a portion of an interconnect test socket interconnect array system that includes a test socket interconnect array with a formed conductive member according to some embodiments of the disclosure.

FIG. 1B shows examples of different types of micro-coaxial wire cables according to some embodiments of the disclosure.

DESCRIPTION OF EMBODIMENTS

Figure 2:
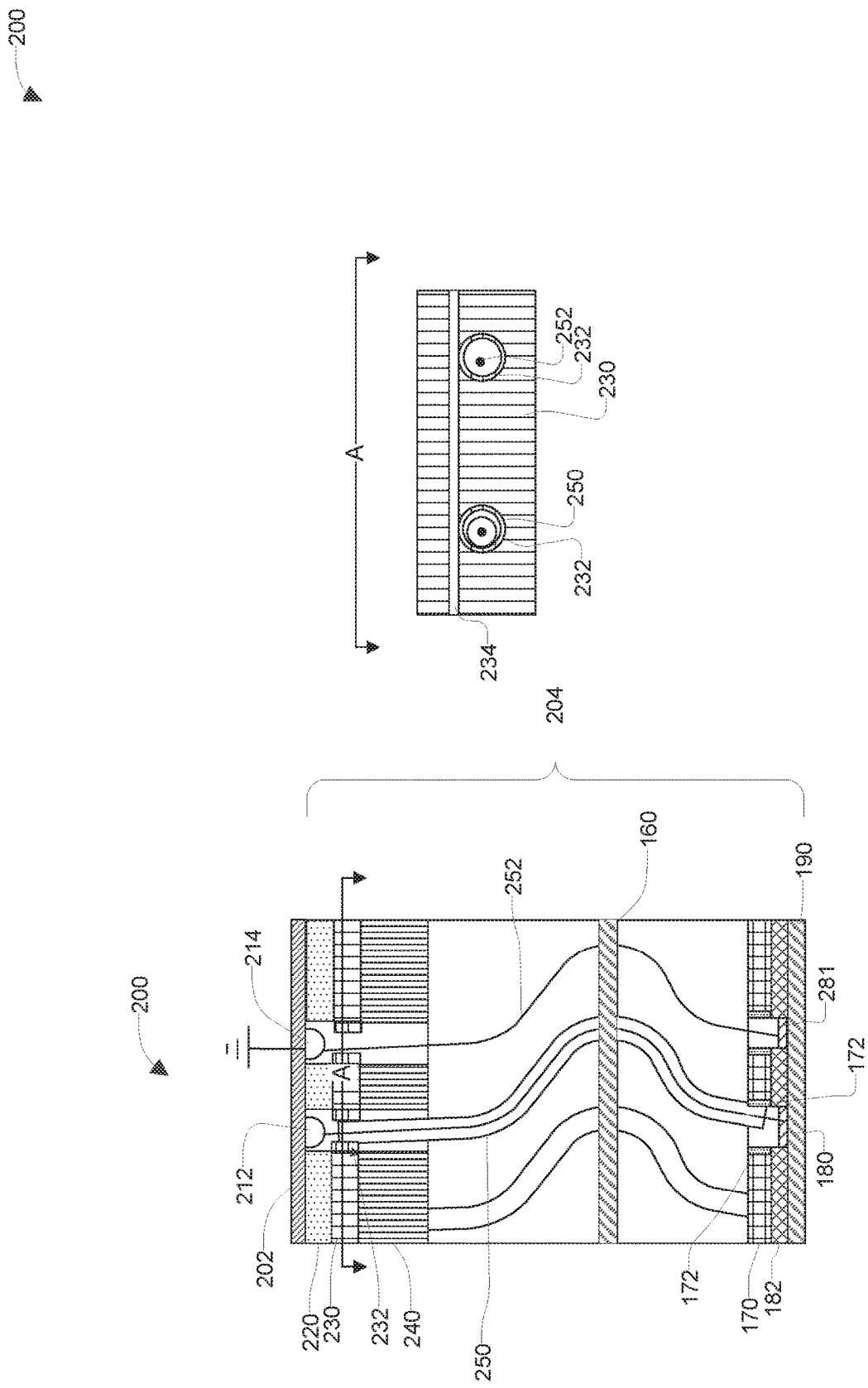
FIG. 2 shows an example of a portion of an interconnect test socket interconnect array system that includes first ground reference architecture according to some embodiments of the disclosure.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Although the present disclosure uses elements of semiconductor chip devices, and their method of manufacture as an example, the disclosure is not so limited. Examples of the present disclosure may be used in any technology where formation of a solder ball in in a solder resist layer is controlled.

FIG. 1A shows an example of a portion of an interconnect test socket interconnect array system 100 that includes a test socket interconnect array 104 with a formed conductive member 150 according to some embodiments of the disclosure. The test socket interconnect array 104 may connect with a device under test (DUT) 102 to test the DUT 102 by passing signals through the formed conductive member 150. While FIG. 1A only shows three exemplary formed wire probes, it is understood that the test socket interconnect array 104 may include an array of more than three formed wire probes.

The test socket interconnect array 104 may include a top portion (e.g., DUT-adjacent) that has a ball guide 120, a conductive layer 130, an active cap layer 132, a stiffener/cap layer 140 to connect to the DUT 102. The ball guide 120 may provide a slot to guide a ball contact 112 of the DUT 102 to contact a conductive core 152 of the formed conductive member 150. The conductive layer 130 may electrically connect to a common DUT ground. The active cap layer 132 may electrically connect the dielectric material 154 to the common DUT ground near a first end. In one example, the stiffener/cap layer 140 is a base layer that provides a support for the upper layers.

The test socket interconnect array 104 may further include a bottom portion (e.g., PCB-adjacent) that has a conductive layer 170, an active cap layer 172, a contact 180, spacer layer 182, and a printed circuit board (PCB) 190 to interface to a tester (not shown). The conductive layer 170 may electrically connect to a common DUT ground. The active cap layer 172 may electrically connect the dielectric material 154 to the common DUT ground near a second end. The spacer layer 182 is a buffer layer that prevents the conductive layer 170 from contacting the contact 180. The contact 180 is a contact that provides signals between the DUT 102 and a tester. The PCB 190 is a base layer.

In some examples, the test socket interconnect array 104 may include a middle layer 160 between the bottom portion and the top portion to prevent rotation between a bottom portion of the test socket interconnect array 104 and a top portion of the test socket interconnect array 104. In one example, the middle layer 160 holds each of the conductive members 150 at a location within a bend in the conductive members 150 as shown. The conductive members 150 are restrained from rotation within the test socket interconnect array 104 because of the offset bend that is constrained by the middle layer 160. In some examples, the test socket interconnect array 104 may be designed without the middle layer 160.

The formed conductive member 150 may be a micro-coaxial cable that has a shape and number of conductors and dielectrics that are tailored to meet the requirements for the test socket interconnect array 104. It is understood that the term "micro-coaxial" may include any form of coaxial cable. The conductors' materials, size, and shape may be determined by the mechanical and electrical requirements of the test socket interconnect array 104. The formed conductive member 150 may have three key elements: 1) a conductive core 152 to provide the electrical path for the formed conductive member 150 and the compliance (modulus of elasticity) to act as an interconnect, 2) dielectric material 154 to set an impedance to a targeted value, and 3) a shielding 156 that includes a conductive coating or material to provide the shielding for transmitted signals and to provide a GND reference.

A thickness of the dielectric material 154 may be driven by impedance requirements of the test and may depend on the dielectric constant of a selected insulator material and the diameter of the conductive core 152. The thickness and material of the shielding 156 of the structure may be sufficiently conductive to complete the ground path as well as be mechanically robust to withstand repeated probe actuation cycles. This shielding outer layer may take different forms, such as a metal coating, a single or multi-conductor wrap or braid, a conductive polymer skin, etc. FIG. 1B shows examples of different types of micro-coaxial wire cables according to some embodiments of the disclosure. The coaxial round-wire cable 106 may include (concentrically from the middle outward): a center conductor, a dielectric material, and a shield. The triaxial round-wire cable 107 may include (concentrically from the middle outward): a center conductor, a dielectric material, a shield, a dielectric material, a conductor, a dielectric material, and a shield. The rectangular coaxial wire cable 108 may include (concentrically from the middle outward): a center conductor, a dielectric material, and a shield. While the formed conductive member 150 is depicted using the coaxial round-wire cable 106, the formed conductive member 150 may be implemented using the triaxial round-wire cable 107, the rectangular coaxial wire cable 108, or another coaxial wire cable.

Once the formed conductive member 150 is manufactured to the desired properties, the formed conductive member 150 may be formed into a desired shape to provide the necessary compliance to meet the requirements of package test. In one example, compliance of the formed conductive member 150 includes physical compliance (for example as a function of modulus of elasticity), and a formed shape provides flexibility without undue metal fatigue.

In the example depicted in FIG. 1A, the formed conductive member 150 may be formed to have an S-shaped bend in the middle to provide a resilient property such that the formed conductive member 150 is able to be compressed to act like a spring to provide constant pressure of the conductive core 152 against the 112 of the DUT 102 when installed. Although one example bend configuration is shown in FIG. 1A, the invention is not so limited. Other bend shapes and dimensions that provide flexibility without undue metal fatigue on the conductive member 150 are within the scope of the invention.

One factor in helping achieve increased bandwidth includes achieving a proper ground reference between the DUT 102 and the tester. FIG. 2 shows an example of a portion of an interconnect test socket interconnect array system 200 that includes first ground reference architecture according to some embodiments of the disclosure. In some examples, the test socket interconnect array 204 may be implemented in the test socket interconnect array 104 of FIG. 1. The test socket interconnect array system may include a DUT 202 connected to a test socket interconnect array 204. The test socket interconnect array 204 of FIG. 2 may include some of the same materials/layers/components as the test socket interconnect array 104 of FIG. 1. Those materials/layers/components that are common among the test socket interconnect array 204 of FIG. 2 and the test socket interconnect array 104 of FIG. 1A use common reference numbers. In the interests of brevity and clarity, description of the formation of these common layers/materials/components will not be repeated.

The test socket interconnect array 204 may include a top portion (e.g., DUT-adjacent) that has a ball guide 220, a conductive layer 230, an active cap layer 232, and a stiffener/cap layer 240 to connect to the DUT 202. The ball guide 220 may provide a first slot to guide the 212 of the DUT 202 to contact a center contact of the first formed conductive member 250 and a second slot to guide the 214 of the DUT 202 to contact the second formed conductive member 252. The conductive layer 230 may electrically connect to a common DUT ground. The active cap layer 232 may electrically connect the shield of the first formed conductive member 250 to the common DUT ground. The 214 may be electrically connected to ground via a routed PCB trace that couples the 214 and the active cap layer 232 to a common ground plane. The stiffener/cap layer 240 is a base layer that provides a support for the upper layers. The first formed conductive member 250 may be used for high speed signals or for signal transmissions that are preferred with low leakage. The second formed conductive member 252 may be used throughout the test socket interconnect array 204 for power pins, ground pins, and any other signal pins that do not require high speed. The second formed conductive member 252 may contact a second contact 281 at a lower portion of the test socket interconnect array 204. A routed PCB trace 234 to connect the DUT and PCB layers to the ground plane between.

Figure 3:
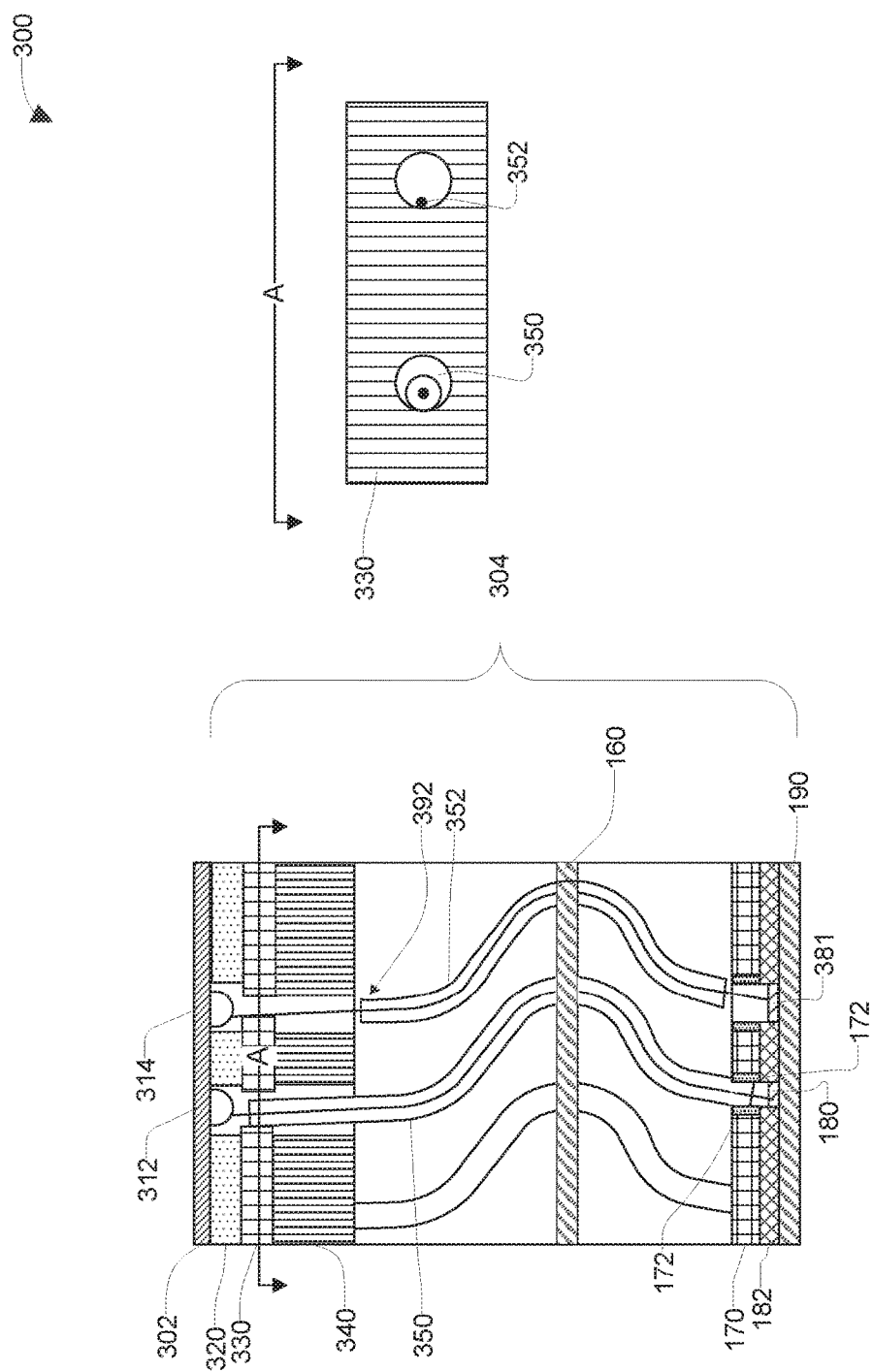
FIG. 3 shows an example of a portion of an interconnect test socket interconnect array system that includes a second ground reference architecture according to some embodiments of the disclosure.

FIG. 3 shows an example of a portion of an test socket interconnect array system 300 that includes a second ground reference architecture according to some embodiments of the disclosure. The test socket interconnect array system 300 may include a DUT 302 connected to the test socket interconnect array 304. In some examples, selected aspects of the test socket interconnect array 304 may be implemented in the test socket interconnect array 104 of FIG. 1. The test socket interconnect array 304 of FIG. 3 may include some of the same materials/layers/components as the test socket interconnect array 104 of FIG. 1. Those materials/layers/components that are common among the test socket interconnect array 304 of FIG. 3 and the test socket interconnect array 104 of FIG. 1A use common reference numbers. In the interests of brevity and clarity, description of the formation of these common layers/materials/components will not be repeated.

The test socket interconnect array 304 may include a top portion (e.g., DUT-adjacent) that has a ball guide 320, a conductive layer 330, and a stiffener/cap layer 340 to connect to the DUT 302. The ball guide 320 may provide a first slot to guide a ball contact 312 of the DUT 302 to contact a center contact of the first formed conductive member 350 and a second slot to guide the 314 of the DUT 302 to contact the second formed conductive member 352. The conductive layer 330 may electrically connect the shield of the first formed conductive member 350 and the center conductor of the second formed conductive member 352 to a common DUT ground.

In one example, the stiffener/cap layer 240 is a base layer that provides a support for the upper layers. The first formed conductive member 350 and the second formed conductive member 352 may be common coaxial conductors. The first formed conductive member 350 may have a short strip to allow the shield to reach the conductive layer 330 and prevent the center conductor of the first formed conductive member 350 from contacting the conductive layer 330. The second formed conductive member 352 may have a longer strip 392 to provide an angle of alignment to allow the center conductor of the second formed conductive member 352 to contact the conductive layer 330. The first formed conductive member 350 may be used through the array of the test socket interconnect array 304 for all signals except ground signal, and the second formed conductive member 352 may be used throughout the test socket interconnect array 304 ground pins.

The second formed conductive member 352 may contact a second contact 381 at a lower portion of the test socket interconnect array 304. Different than the test socket interconnect array 204 of FIG. 2, the conductive layer 330 as a layer replaces the routed PCB, so the grounding now goes thru the conductive top and bottom plate instead. This conductive layer 330 may also act as a stiffener to ensure that a preload force is maintained across the test socket interconnect array 304. Another benefit to this solution is that the same wire type with different stripping conditions may be used throughout the array.

Figure 4:
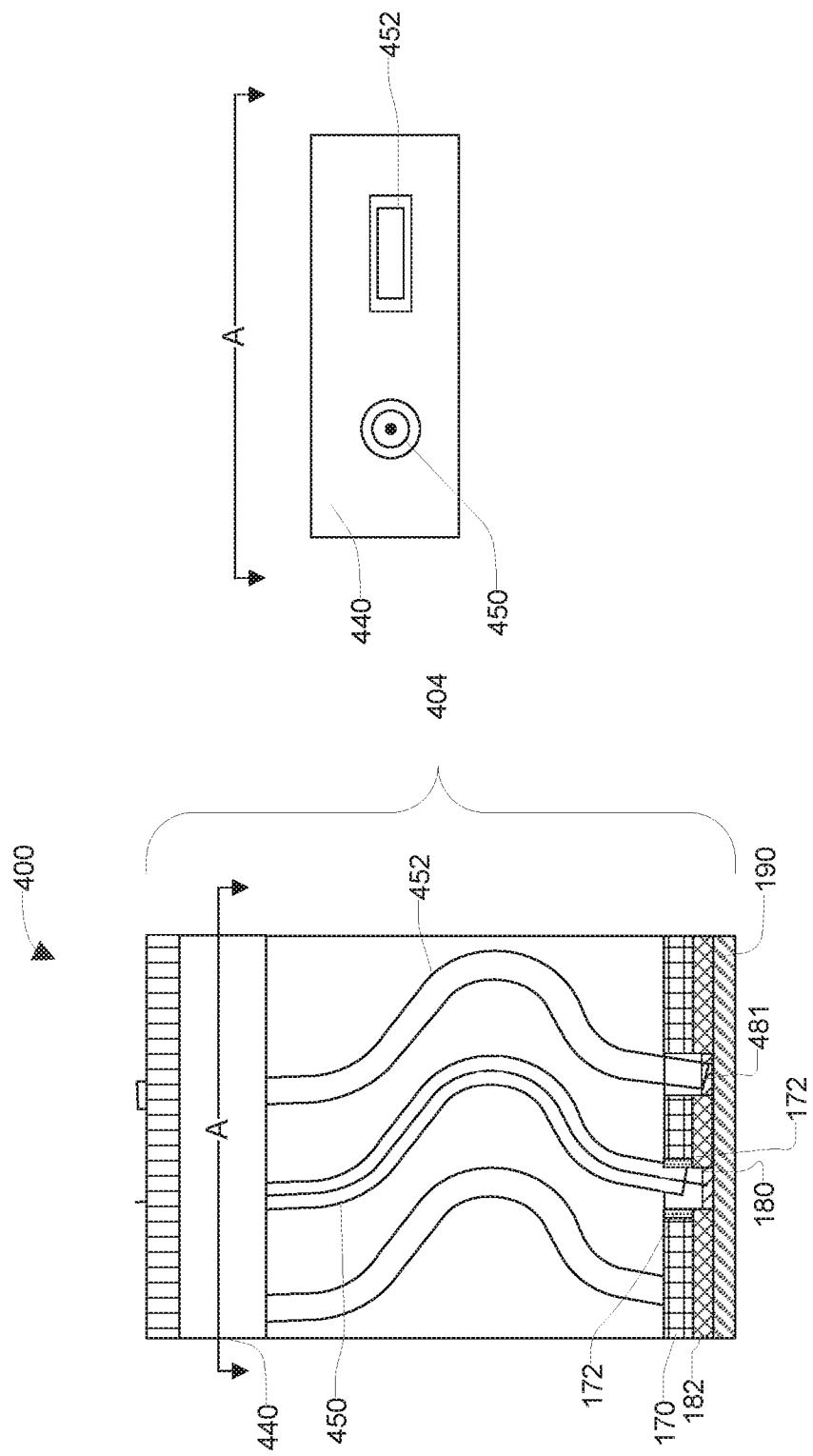
FIG. 4 shows an example of a portion of an interconnect test socket interconnect array system that includes a third ground reference architecture according to some embodiments of the disclosure.

FIG. 4 shows an example of a portion of an interconnect test socket interconnect array system 400 that includes a third ground reference architecture according to some embodiments of the disclosure. The test socket interconnect array system 400 may include a test socket interconnect array 404. In some examples, the test socket interconnect array 404 may be implemented in the test socket interconnect array 104 of FIG. 1. The test socket interconnect array 404 of FIG. 4 may include some of the same materials/layers/components as the test socket interconnect array 104 of FIG. 1. Those materials/layers/components that are common among the test socket interconnect array 404 of FIG. 4 and the test socket interconnect array 104 of FIG. 1A use common reference numbers. In the interests of brevity and clarity, description of the formation of these common layers/materials/components will not be repeated for each figure.

The test socket interconnect array 404 may include a top portion (e.g., PCB-adjacent) that has a conductive layer 430, and a stiffener/cap layer 440 to connect to a DUT. The first formed conductive member 450 may include a round coaxial conductors for use in transmitting high speed signals and other input/output (I/O) signals. The second formed conductive member 452 may be a rectangular cross-section conductor that is used for power and ground pins. The second formed conductive member 452 may contact a second contact 481 at a lower portion of the test socket interconnect array 404. The rectangular features of the second formed conductive member 452 may provide natural anti-rotation to the test socket interconnect array 404, and reduce a need for the middle layer 160 of FIGS. 1-3. Although a rectangular cross section is used as an example in FIG. 4, the invention is not so limited. Other angular cross section shapes, may be used (for example, square, triangular, etc.) where the angular cross section resists unwanted rotation.

Figure 5:
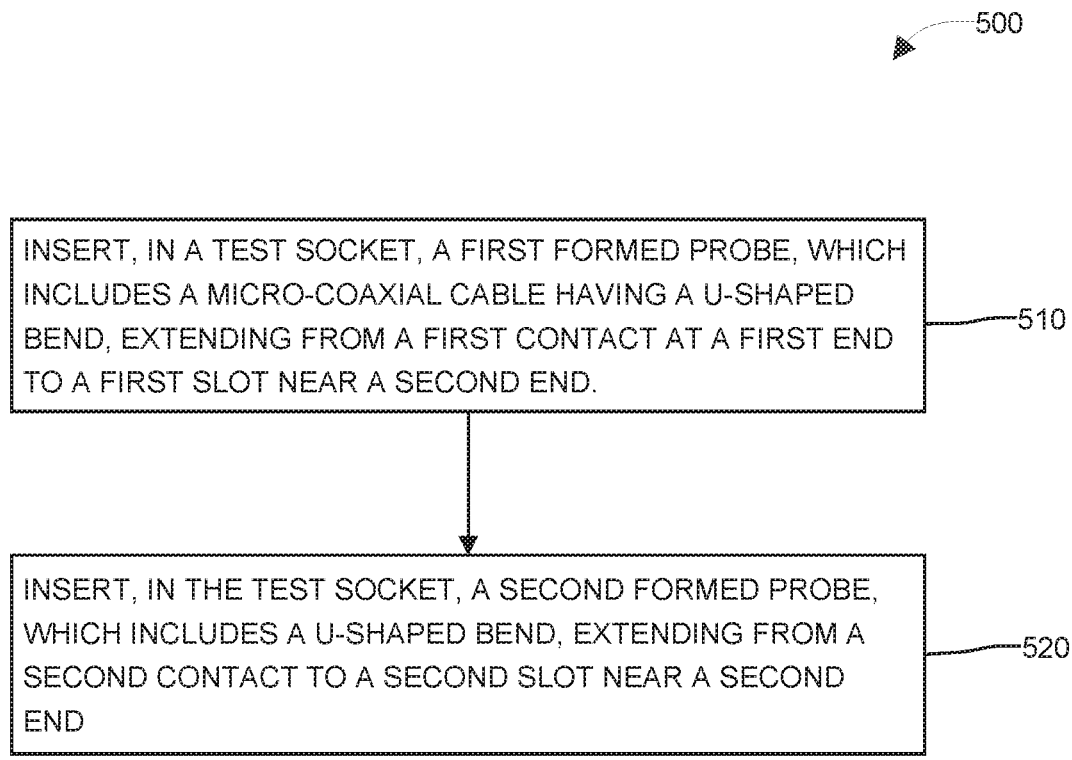
FIG. 5 shows a flow chart for a method to form a test socket interconnect array according to some embodiments of the disclosure.
Figure 6:
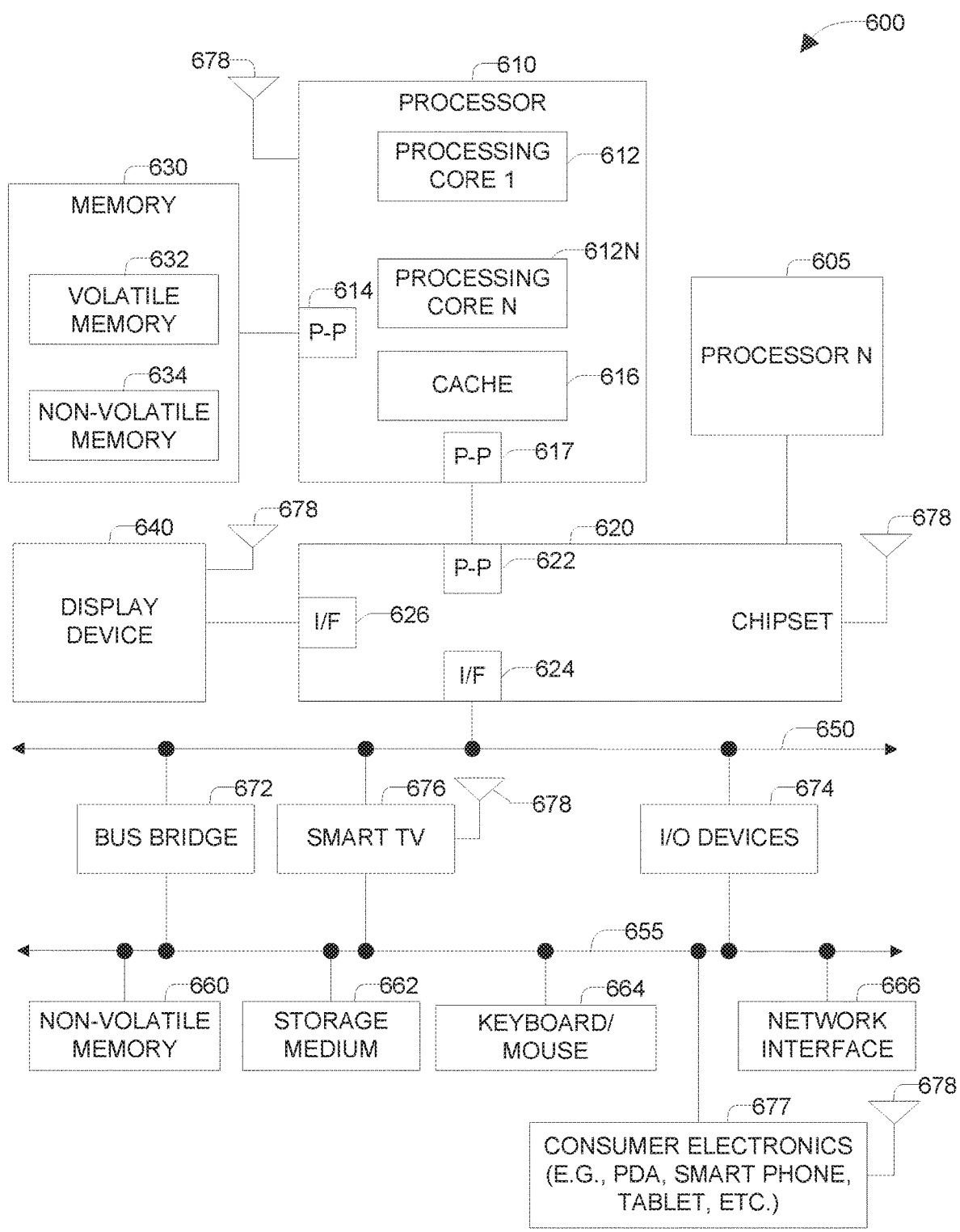
FIG. 6 illustrates a system level diagram, according to some embodiments of the disclosure.

FIG. 5 illustrates a method 500 to form a test socket interconnect array according to some embodiments of the disclosure. The method 500 may be implemented the test socket interconnect array 104 of FIG. 1, the test socket interconnect array 204 of FIG. 2, the test socket interconnect array 304 of FIG. 3, the test socket interconnect array 404 of FIG. 4, or combinations thereof.

The method 500 may include inserting a first formed conductive member extending from a first contact at a first end to a first slot near a second end, at 510. The first slot may be configured to align with a first contact of a device under test (e.g., the device under test 102, 202, and/or 302 of FIGS. 1A, 2, and 3, respectively). The first formed conductive member may include the formed conductive member 150 of FIG. 1, first formed conductive member 250 of FIG. 2, the first formed conductive member 350 of FIG. 3, and/or the first formed conductive member 450 of FIG. 4. The first formed conductive member includes a micro-coaxial cable having a flexible formed configuration such as an S-shaped or C-shaped bend. The micro-coaxial cable may include one of the micro-coaxial cables 106, 107, or 108 of FIG. 1B. The first contact may include the contact 180 of FIGS. 1A, 2, 3, and/or 4.

The method 500 may include inserting a second formed conductive member extending from a second contact to a second slot near a second end, at 520. The second slot is configured to align with a second contact of the device under test. The first formed conductive member may include the formed conductive member 150 of FIG. 1, second formed conductive member 252 of FIG. 2, the second formed conductive member 352 of FIG. 3, and/or the second formed conductive member 452 of FIG. 4. The second formed conductive member may include a flexible formed configuration such as an S-shaped or C-shaped bend. The micro-coaxial cable may include one of the micro-coaxial cables 106, 107, or 108 of FIG. 1B. The first contact may include the contact 180 of FIGS. 1A, 2, 3, and/or 4. In some examples, a type of the micro-coaxial cable of the first formed conductive member is the same as a type of the second micro-coaxial cable of the second formed conductive member. In other examples, a type of the micro-coaxial cable of the first formed conductive member is different than as a type of the second micro-coaxial cable of the second formed conductive member.

The method 500 may further include forming a first active cap layer to contact a shield of the first formed conductive member near the first end, and forming a second active cap layer to contact the shield of the first formed conductive member near the second end. The first active cap layer may include the active cap layer 132 of FIG. 1A or the active cap layer 232 of FIG. 2. The second active cap layer may include the active cap layer 180 of FIGS. 1A, 2, 3, and 4. The method 500 may further include forming a printed circuit board trace that couples the first active cap layer to a ground node. The printed circuit board trace may include the PCB trace 234 of FIG. 2.

The method 500 may further include forming a ball guide layer having slots to guide the first contact to contact to the first formed conductive member and to guide the second contact of the device under test to contact the second formed conductive member. The ball guide layer may include the ball guide 120 of FIG. 1A, the ball guide 220 of FIG. 2, and/or the ball guide 320 of FIG. 3.

In some examples, the second formed conductive member may have a rectangular cross section, and/or may include a second micro-coaxial cable. In some examples, the method 500 may further include forming a conductive layer to contact a shield of the first formed conductive member near the second end and to contact a center conductor of the second formed conductive member near the second end. The conductive layer may include the conductive layer 330 of FIG. 3.

In some examples, the method 500 may further include stripping the shield and dielectric material of the second formed conductive member away near the second end to expose a first portion of the center conductor of the second formed conductive member, and stripping the shield and dielectric material of the first formed conductive member away near the second end to expose a first portion of the center conductor of the first formed conductive member. In some examples, the first portion of the center conductor of the first formed conductive member has a shorter length than the first portion of the center conductor of the second formed conductive member. In some examples, the method 500 may further include inserting a middle layer to hold the first formed conductive member and the second formed conductive member in place and prevent independent rotation of individual portions of the test socket interconnect array.

To better illustrate the methods and device disclosed herein, a non-limiting list of embodiments is provided here:

Example 1 includes an apparatus, comprising a test socket interconnect array. The test socket interconnect array includes a first formed conductive member extending from a first contact at a first end to a first slot near a second end, wherein the first slot is configured to align with a first contact of a device under test, wherein the first formed conductive member includes a coaxial conductor having a flexible bend, and a second formed conductive member, different from the first formed conductive member, extending from a second contact to a second slot near a second end, wherein the second slot is configured to align with a second contact of the device under test, wherein the second formed conductive member has a flexible bend.

Example 2 includes the apparatus of example 1, wherein the second formed conductive member is a bare wire.

Example 3 includes the apparatus of any one of examples 1-2, wherein the test socket interconnect array further comprises a first conductive layer to contact a shield of the first formed conductive member near the first end, and a second conductive layer to contact the shield of the first formed conductive member near the second end.

Example 4 includes the apparatus of any one of examples 1-3, wherein the test socket interconnect array further comprises a routed printed circuit board trace coupling the first conductive layer to a ground node.

Example 5 includes the apparatus of any one of examples 1-4, wherein the test socket interconnect array further comprises a ball guide layer having slots to guide the first contact to contact to the first formed conductive member and to guide the second contact of the device under test to contact the second formed conductive member.

Example 6 includes the apparatus of any one of examples 1-5, wherein the second formed conductive member has a rectangular cross section.

Example 7 includes the apparatus of any one of examples 1-6, wherein the second formed conductive member includes a second coaxial cable.

Example 8 includes the apparatus of any one of examples 1-7, wherein the test socket interconnect array further comprises a conductive layer to contact a shield of the first formed conductive member near the second end and to contact a center conductor of the second formed conductive member near the second end.

Example 9 includes the apparatus of any one of examples 1-8, wherein the shield and dielectric material of the second formed conductive member is stripped away near the second end to expose a first portion of the center conductor of the second formed conductive member, and wherein the shield and dielectric material of the first formed conductive member is stripped away near the second end to expose a first portion of the center conductor of the first formed conductive member, wherein the first portion of the center conductor of the first formed conductive member has a shorter length than the first portion of the center conductor of the second formed conductive member.

Example 10 includes the apparatus of any one of examples 1-9, wherein a type of the coaxial cable of the first formed conductive member is the same as a type of the second coaxial cable of the second formed conductive member.

Example 11 includes the apparatus of any one of examples 1-10, wherein a type of the coaxial cable of the first formed conductive member is different than a type of the second coaxial cable of the second formed conductive member.

Example 12 includes the apparatus of any one of examples 1-11, wherein a type of the coaxial cable of the first formed conductive member is one of a coaxial round wire, a triaxial round wire, or a rectangular coaxial wire.

Example 13 includes the apparatus of any one of examples 1-12, wherein the test socket interconnect array further comprises a middle layer to hold the first formed conductive member and the second formed conductive member in place and prevent independent rotation of individual portions of the test socket interconnect array.

Example 14 includes a method to form a test socket interconnect array. The method includes inserting a first formed conductive member extending from a first contact at a first end to a first slot near a second end, wherein the first slot is configured to align with a first contact of a device under test, wherein the first formed conductive member includes a coaxial cable having a flexible bend, and inserting a second formed conductive member extending from a second contact to a second slot near a second end, wherein the second slot is configured to align with a second contact of the device under test, wherein the second formed conductive member has a flexible bend.

Example 15 includes the method of example 14, wherein the second formed conductive member is a bare wire.

Example 16 include the method of any one of examples 14-15, further comprising forming a conductive layer to contact a shield of the first formed conductive member near the first end and forming a second conductive layer to contact the shield of the first formed conductive member near the second end.

Example 17 include the method of any one of examples 14-16, further comprising forming a printed circuit board trace that couples the first conductive layer to a ground node.

Example 18 include the method of any one of examples 14-17, further comprising forming a ball guide layer having slots to guide the first contact to contact to the first formed conductive member and to guide the second contact of the device under test to contact the second formed conductive member.

Example 19 include the method of any one of examples 14-18, wherein the second formed conductive member has a rectangular cross section.

Example 20 include the method of any one of examples 14-19, wherein the second formed conductive member includes a second coaxial cable.

Example 21 include the method of any one of examples 14-20, further comprising forming a conductive layer to contact a shield of the first formed conductive member near the second end and to contact a center conductor of the second formed conductive member near the second end.

Example 22 include the method of any one of examples 14-21, further comprising stripping the shield and dielectric material of the second formed conductive member away near the second end to expose a first portion of the center conductor of the second formed conductive member, and stripping the shield and dielectric material of the first formed conductive member away near the second end to expose a first portion of the center conductor of the first formed conductive member, wherein the first portion of the center conductor of the first formed conductive member has a shorter length than the first portion of the center conductor of the second formed conductive member.

Example 23 include the method of any one of examples 14-22, wherein a type of the coaxial cable of the first formed conductive member is the same as a type of the second coaxial cable of the second formed conductive member.

Example 24 include the method of any one of examples 14-23, wherein a type of the coaxial cable of the first formed conductive member is different than as a type of the second coaxial cable of the second formed conductive member.

Example 25 include the method of any one of examples 14-24, wherein a type of the coaxial cable of the first formed conductive member is one of a coaxial round wire, a triaxial round wire, or a rectangular coax wire.

Example 26 include the method of any one of examples 14-25, further comprising inserting a middle layer to hold the first formed conductive member and the second formed conductive member in place and prevent independent rotation of individual portions of the test socket interconnect array.

These examples are intended to provide non-limiting examples of the present subject matter—they are not intended to provide an exclusive or exhaustive explanation. The detailed description above is included to provide further information about the present devices, and methods.

The above detailed description includes references to the accompanying drawings, which form a part of the detailed description. The drawings show, by way of illustration, specific embodiments in which the disclosure can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the disclosure should be determined with reference to the appended claims, along with the full scope of equivalents to which such claims are entitled.

What is claimed is:

1. An apparatus, comprising:
a test socket interconnect array comprising:
a first, shielded, formed conductive member extending from a first contact at a first end to a first slot near a second end, wherein the first slot is configured to align with a first contact of a device under test, wherein the first formed conductive member includes a coaxial conductor having a flexible bend; and
a second, unshielded, formed conductive member, extending from a second contact to a second slot near a second end, wherein the second slot is configured to align with a second contact of the device under test, wherein the second formed conductive member has a flexible bend.

2. The apparatus of claim 1, wherein the second formed conductive member is a bare wire.

3. The apparatus of claim 2, wherein the test socket interconnect array further comprises:
a first conductive layer to contact a shield of the first formed conductive member near the first end; and
a second conductive layer to contact the shield of the first formed conductive member near the second end.

4. The apparatus of claim 3, wherein the test socket interconnect array further comprises a routed printed circuit board trace coupling the first conductive layer to a ground node.

5. The apparatus of claim 2, wherein the second formed conductive member has a rectangular cross section.

6. The apparatus of claim 1, wherein the test socket interconnect array further comprises a ball guide layer having slots to guide the first contact to contact to the first formed conductive member and to guide the second contact of the device under test to contact the second formed conductive member.

7. The apparatus of claim 1, wherein the second formed conductive member includes a second coaxial cable.

8. The apparatus of claim 7, wherein the test socket interconnect array further comprises a conductive layer to contact a shield of the first formed conductive member near the second end and to contact a center conductor of the second formed conductive member near the second end.

9. The apparatus of claim 7, wherein the shield and dielectric material of the second formed conductive member is stripped away near the second end to expose a first portion of the center conductor of the second formed conductive member, and wherein the shield and dielectric material of the first formed conductive member is stripped away near the second end to expose a first portion of the center conductor of the first formed conductive member, wherein the first portion of the center conductor of the first formed conductive member has a shorter length than the first portion of the center conductor of the second formed conductive member.

10. The apparatus of claim 7, wherein a type of the coaxial cable of the first formed conductive member is the same as a type of the second coaxial cable of the second formed conductive member.

11. The apparatus of claim 7, wherein a type of the coaxial cable of the first formed conductive member is different than a type of the second coaxial cable of the second formed conductive member.

12. The apparatus of claim 7, wherein a type of the coaxial cable of the first formed conductive member is one of a coaxial round wire, a triaxial round wire, or a rectangular coaxial wire.

13. The apparatus of claim 1, wherein the test socket interconnect array further comprises a middle layer to hold the first formed conductive member and the second formed conductive member in place and prevent independent rotation of individual portions of the test socket interconnect array.

14. A method to form a test socket interconnect array, comprising:
inserting a first, shielded, formed conductive member extending from a first contact at a first end to a first slot near a second end, wherein the first slot is configured to align with a first contact of a device under test, wherein the first formed conductive member includes a coaxial cable having a flexible bend; and
inserting a second, unshielded, formed conductive member extending from a second contact to a second slot near a second end, wherein the second slot is configured to align with a second contact of the device under test, wherein the second formed conductive member has a flexible bend.

15. The method of claim 14, wherein the second formed conductive member is a bare wire.

16. The method of claim 15, further comprising:
forming a conductive layer to contact a shield of the first formed conductive member near the first end; and
forming a second conductive layer to contact the shield of the first formed conductive member near the second end.

17. The method of claim 16, further comprising forming a printed circuit board trace that couples the first conductive layer to a ground node.

18. The method of claim 15, wherein the second formed conductive member has a rectangular cross section.

19. The method of claim 14, further comprising forming a ball guide layer having slots to guide the first contact to contact to the first formed conductive member and to guide the second contact of the device under test to contact the second formed conductive member.

20. The apparatus of claim 14, wherein the second formed conductive member includes a second coaxial cable.

21. The method of claim 20, further comprising forming a conductive layer to contact a shield of the first formed conductive member near the second end and to contact a center conductor of the second formed conductive member near the second end.

22. The method of claim 20, further comprising:
stripping the shield and dielectric material of the second formed conductive member away near the second end to expose a first portion of the center conductor of the second formed conductive member; and
stripping the shield and dielectric material of the first formed conductive member away near the second end to expose a first portion of the center conductor of the first formed conductive member, wherein the first portion of the center conductor of the first formed conductive member has a shorter length than the first portion of the center conductor of the second formed conductive member.

23. The method of claim 20, wherein a type of the coaxial cable of the first formed conductive member is the same as a type of the second coaxial cable of the second formed conductive member.

24. The method of claim 20, wherein a type of the coaxial cable of the first formed conductive member is one of a coaxial round wire, a triaxial round wire, or a rectangular coax wire.

25. The method of claim 14, further comprising inserting a middle layer to hold the first formed conductive member and the second formed conductive member in place and prevent independent rotation of individual portions of the test socket interconnect array.

* * * * *